United States Patent
Chenebaux

(10) Patent No.: US 9,438,218 B2
(45) Date of Patent: Sep. 6, 2016

(54) PHOTOREPEATED INTEGRATED CIRCUIT WITH COMPENSATION OF THE PROPAGATION DELAYS OF SIGNALS, NOTABLY OF CLOCK SIGNALS

(71) Applicant: PYXALIS, Moirans (FR)

(72) Inventor: Grégoire Chenebaux, Grenoble (FR)

(73) Assignee: PYXALIS, Moirans (FR)

( * ) Notice: Subject to any disclaimer, the term of this patent is extended or adjusted under 35 U.S.C. 154(b) by 0 days.

(21) Appl. No.: 14/815,292

(22) Filed: Jul. 31, 2015

(65) Prior Publication Data
US 2016/0036427 A1    Feb. 4, 2016

(30) Foreign Application Priority Data
Aug. 1, 2014    (FR) ..................................... 14 57486

(51) Int. Cl.
| | |
|---|---|
| *H03K 5/159* | (2006.01) |
| *G06F 13/16* | (2006.01) |
| *G06F 1/10* | (2006.01) |
| *H03K 5/13* | (2014.01) |

(52) U.S. Cl.
CPC ................ *H03K 5/159* (2013.01); *G06F 1/10* (2013.01); *G06F 13/16* (2013.01); *H03K 5/133* (2013.01)

(58) Field of Classification Search
CPC ............. G06F 1/10; G06F 1/06; G06F 1/04; H03K 5/15013; G11C 7/22
USPC ................................................. 327/291, 295
See application file for complete search history.

(56) References Cited

U.S. PATENT DOCUMENTS

| | | | | |
|---|---|---|---|---|
| 5,172,330 | A * | 12/1992 | Watanabe | .................. G06F 1/10 326/101 |
| 5,519,350 | A * | 5/1996 | Diodato | ............. H04L 25/0272 327/295 |
| 5,586,307 | A * | 12/1996 | Wong | .................... G06F 1/3237 327/144 |
| 5,881,271 | A * | 3/1999 | Williams | .................. G06F 1/10 713/401 |
| 9,299,416 | B2 * | 3/2016 | Tajima | ................ G11C 11/4076 |
| 2004/0189349 | A1* | 9/2004 | Kuzmenka | ............. H03K 5/082 327/52 |
| 2007/0214377 | A1* | 9/2007 | Jarrar | ........................ G06F 1/10 713/401 |
| 2008/0201597 | A1 | 8/2008 | Chong et al. | |
| 2009/0161453 | A1 | 6/2009 | Giovannini et al. | |
| 2012/0119805 | A1* | 5/2012 | John | ................... G06F 17/5031 327/161 |
| 2013/0050553 | A1* | 2/2013 | Bugnet | ............... H04N 5/3743 348/308 |

FOREIGN PATENT DOCUMENTS

EP    2 680 153 A1    1/2014

\* cited by examiner

*Primary Examiner* — Quan Tra
(74) *Attorney, Agent, or Firm* — Baker & Hostetler LLP

(57) ABSTRACT

Integrated circuits of large size produced by photorepetition of several mutually identical partial patterns are provided, more precisely to the compensation of propagation delays of signals (notably of clock signals) from one partial circuit to the following whereas the signals concerned must reach the various partial circuits simultaneously for proper operation of the whole. The compensation circuit provided in each partial circuit comprises a main transmission line for a master clock signal and a compensation line with multiple outputs, as well as a multiplexer for selecting one of the outputs, the output selected being different in the various partial circuits. The multiplexer provides a local clock signal in each partial circuit and these clock signals are synchronous despite the propagation delays.

5 Claims, 3 Drawing Sheets

PHOTOREPEATED INTEGRATED CIRCUIT WITH COMPENSATION OF THE PROPAGATION DELAYS OF SIGNALS, NOTABLY OF CLOCK SIGNALS

CROSS-REFERENCE TO RELATED APPLICATION

This application claims priority to foreign French patent application No. FR 1457486, filed on Aug. 1, 2014, the disclosure of which is incorporated by reference in its entirety.

FIELD OF THE INVENTION

The invention relates to integrated circuits of large dimension with repetitive juxtaposed patterns, produced by repeated partial exposure of one and the same pattern in several zones of one and the same substrate.

BACKGROUND

This production technique is sometimes called the "stitching" technique; it consists in using, during a step of photolithographic exposure of an integrated circuit substrate, one and the same mask defining the pattern to be reproduced, which mask is shifted successively from one zone of the substrate to another adjacent zone, in the course of exposure sub-steps. The photolithography step consisting of this succession of sub-steps can be supplemented with other sub-steps of exposure of additional zones corresponding to different patterns, and therefore exposed through one or more different masks. The photolithography step is for example a step of defining a pattern of conductors in a conducting layer deposited on the substrate. Other photolithography steps are performed for the fabrication of the integrated circuit, and stitching, therefore repeated exposure of one and the same pattern in adjacent zones, will also be undertaken for each of them; this culminates, at the end of all the photolithography steps and at the end of the associated physical or chemical treatments, in an integrated circuit, certain mutually adjacent zones of which are strictly mutually identical.

In integrated circuits having a significant dimension of several centimetres by several centimetres and having to work at high operating speeds, a difficulty is encountered, namely the limited propagation speed of the signals; this limited speed gives rise to the risk that one and the same control signal, which must serve to control several identical circuits simultaneously, is transmitted with a non-zero time shift between the various identical zones. In particular, in the circuits which operate with a high-frequency clock, one and the same clock signal produced at one place in the integrated circuit may reach the various parts of the circuit at mutually shifted instants whereas these signals ought to arrive simultaneously for proper operation of the whole. For circuits of several centimetres by several centimetres, the shift may be several tens of nanoseconds, this being incompatible with operating rates of several tens of megahertz.

Document US 2008/201597 describes a memory system in which a clock signal propagates from one memory device to the next. This system comprises a memory interface including a circuit for compensating the propagation delays of the signals, based on the use of a tapped delay line and of multiplexers to select one from among the output signals of the said delay line.

SUMMARY OF THE INVENTION

The invention is aimed at facilitating the transmission of the signals, and notably of the clock signals in such stitched circuits of significant dimensions, so that the rising or falling edges of these signals are not overly shifted in time when they reach similar points of identical zones.

Accordingly, there is proposed according to the invention an integrated circuit formed by photorepetition of N adjacent patterns, all identical, corresponding to N adjacent identical partial circuits of rank $i=1$ to $i=N$ in the order of geographical succession of the partial circuits, the integrated circuit requiring for its operation a master signal (preferably a clock signal) received on a partial circuit of rank 1 and transmitted in cascade from a partial circuit of rank i to the partial circuit of rank $i+1$ by a main conducting line in each partial circuit, this main line introducing a propagation delay of duration T between an input of the main line and an output of the main line linked to a main line input of the circuit of immediately following rank, characterized in that it comprises in each partial circuit of rank i:

a compensation conducting line with N successive outputs of rank $i=1$ to N, linked to the main line and establishing a propagation delay of duration T between the successive outputs, a multiplexer with N inputs linked respectively to each of the N outputs of the compensation conducting line, control lines of the multiplexer, which are designed to select the multiplexer's input of rank i, linked to the output of rank $N-i+1$ from among the N outputs of the compensation conducting line, the output of the multiplexer of the partial circuit of rank i providing a local signal (preferably a local clock signal) for this partial circuit.

Preferably, the control lines of the multiplexer of the partial circuit of rank 1 receive a signal for selecting the input of rank 1 of this multiplexer, and propagate this signal from one multiplexer to the following while modifying it each time so as to increment the rank of the selected input by one unit, and thus to decrement the rank of the selected output by one unit. Thus, the control lines ending at the multiplexer of the partial circuit of rank i select the output of rank $N-i+1$ of this circuit and transmit to the multiplexer of the partial circuit of rank $i+1$ a command for selecting the output of rank $N-i$.

One way of proceeding consists in using N control lines for the multiplexers and from among which only a line of rank i (for the multiplexer of the circuit of rank i) is active so as to select the input of rank i of the multiplexer, that is to say the output of rank $N-i+1$ of the compensation line; the other control lines are inactive; the control lines received by the multiplexer of the partial circuit of rank i are linked to the control lines of the multiplexer of the partial circuit of rank $i+1$ with a circular permutation so that the active control line of rank i of the multiplexer of the partial circuit of rank i is linked to a control line of rank $i+1$ of the multiplexer of the partial circuit of rank $i+1$, the latter line selecting, when it is active, the output of rank $N-i$ of the compensation line of the partial circuit of rank $i+1$.

In a practical embodiment, a buffer amplifier is inserted into the main line and a respective identical buffer amplifier is inserted into the compensation line, between each output of the latter and the output of immediately following rank of the line. The amplifiers all introduce the same propagation delay and are in practice all identical in a given partial circuit and in all the other partial circuits.

BRIEF DESCRIPTION OF THE DRAWINGS

Other characteristics and advantages of the invention will become apparent on reading the detailed description which follows and which is given with reference to the appended drawings in which.

DETAILED DESCRIPTION

Figure 1:
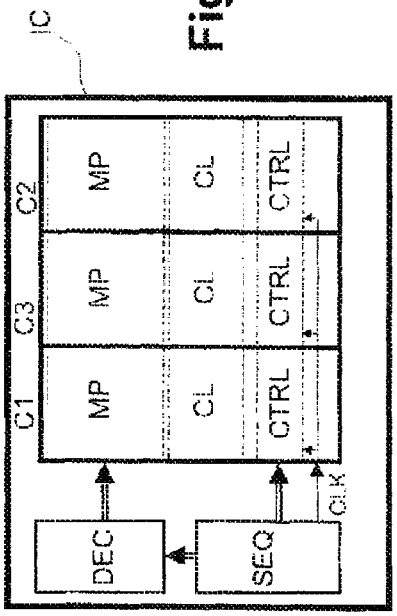
FIG. 1 represents a general organization diagram of an exemplary integrated circuit chip obtained by photorepetition of strictly identical patterns.

To illustrate the invention, in FIG. 1 has been represented an integrated circuit chip IC produced in part by photorepetition of identical patterns, in an example which is an image sensor. In this example, the chip comprises three identical partial circuits C1, C2, C3 represented in the form of solid-line rectangles, and it is these three circuits which are produced by photorepetition of one and the same pattern. There cannot be the least difference between the three circuits. The patterns are juxtaposed and conducting links are established between the adjacent circuits by simple abutting of a pattern of a partial circuit with a pattern of the adjacent circuit.

In this example, each partial circuit comprises a matrix MP of photosensitive pixels and, at the bottom of the matrix, a readout circuit CL for gathering the signals arising from the pixels of the partial circuit, and a digital control circuit CTRL for controlling the readout circuits of the partial circuit. These various circuits are demarcated by dashed lines.

The chip may moreover comprise other electronic circuits, not photorepeated, for example a general sequencer circuit SEQ intended to produce control signals for the partial circuits and notably a master clock signal CLK which serves as general reference for the progress of the sensor operating sequences. Another circuit DEC comprises a rows decoder for the successive addressing of the rows of the matrix during the operations of reading out the signals arising from the pixels. This decoder simultaneously addresses the rows of like rank of the matrices MP of the three partial circuits. This general organization of the chip is given only by way of example, the invention being applicable whatever the circuits of the chip when it is necessary to tightly control the synchronization of the edges of clock signals used in the various identical partial circuits, or the synchronization of other control signals used in the partial circuits. In this organization, as is well known for circuits formed by photorepetition, the partial circuits are connected together, that is to say a conductor arriving at a right lateral edge of a partial circuit is in direct contact with a conductor leaving at the same place from the left lateral edge of the immediately adjacent circuit of following rank. Thus, for example, a row conductor joining the pixels of a row of a matrix MP is in continuity with a row conductor of the matrices MP of the other partial circuits.

By way of indication, use is made of methods for photorepeating identical partial circuits on one and the same chip for chips of large dimensions, that is to say above 2 centimetres wide. The propagation times over distances of this order cannot descend below 20 nanoseconds, which is not negligible when it is desired to work at frequencies of several tens or hundreds of MHz. If there are N adjacent partial circuits each being 2 centimetres wide, the times for propagation up to the last partial circuit are multiplied by N.

Figure 2:
FIG. 2 represents a diagram in which a compensation circuit is introduced into each partial circuit in accordance with the invention.

FIG. 2 represents a general architecture derived from that of FIG. 1 but in which in each identical partial circuit has been represented a surface portion reserved for a circuit CCMP for compensating the risks of poor synchronization due to the times for the signals to propagate from one partial circuit to another. This circuit CCMP, identical in the various partial circuits, essentially comprises the following elements: an upstream clock input, a downstream clock output, a main transmission line between this input and this output, a compensation line with multiple outputs, and a multiplexer linked to the multiple outputs. The multiplexer provides a local clock signal to the remainder of the partial circuit. What is stated here of the clock signals arising at the outset from a master clock CLK originating from the sequencer SEQ may be applied to control signals other than the master clock signal and to simplify the explanations only the compensation of the master clock signal CLK will be considered.

Figure 3:
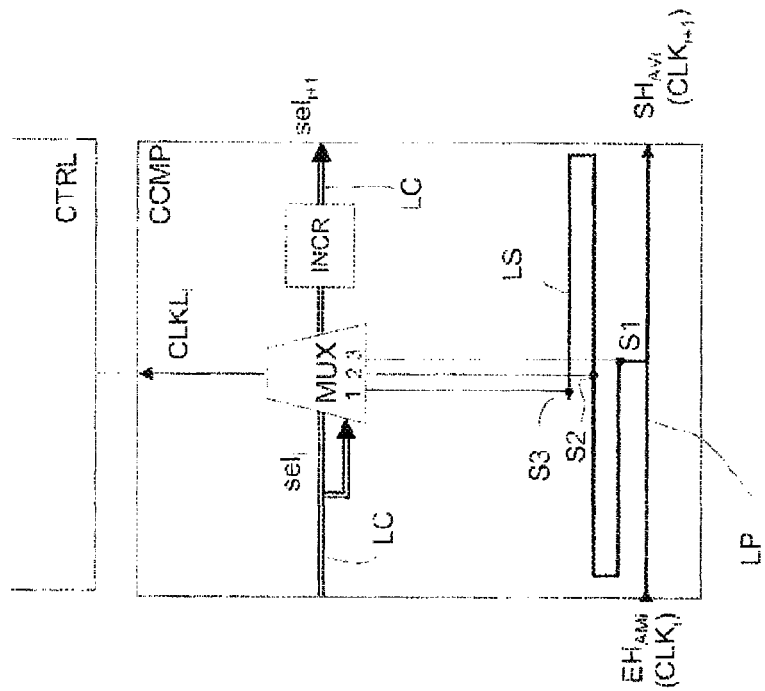
FIG. 3 represents an embodiment diagram for producing the compensation circuit of the invention.

The compensation circuit portion CCMP is more precisely represented in FIG. 3, for a partial circuit of intermediate rank i where i is an index from 1 to N if there are N identical adjacent partial circuits. In this example, N=3.

The upstream clock signal input is designated by $EH_{AMi}$. The downstream clock signal output is designated by $SH_{AVi}$, and is linked directly to the upstream clock signal input of the immediately following partial circuit. The link is a link by simple abutting of the patterns of the two partial circuits, the main line being a continuous line extending through the succession of partial circuits. The input $EH_{AMi}$ receives an upstream clock signal $CLK_i$ of a partial circuit of preceding rank and the output $SH_{AVi}$ transmits a downstream clock signal $CLK_{i+1}$ to a partial circuit of following rank if there is one. The first partial circuit, of rank 1, receives an upstream clock signal $CLK_1$ which is the master clock signal CLK arising from the sequencer of FIGS. 1 and 2.

The main conducting line transmitting the clock signal from one partial circuit to the next is designated by LP; it extends between the input $EH_{AMi}$ and the output $SH_{AVi}$, and has a length L which causes a transmission delay of duration T of the transition edges of the clock signals which are propagated on this line. In the simplest configuration, the main line LP is a straight conducting line going directly from the input to the output and having a length equal to the width of the partial circuit (width reckoned in the direction of juxtaposition of the partial circuits, that is to say horizontally in all the figures). It inevitably introduces a propagation delay of duration T between the rising edges of the upstream clock signal $CLK_i$ present on the input $EH_{AMi}$ and the rising edges of the downstream clock signal $CLK_{i+1}$ present on the output $SH_{AVi}$. This delay originates on the one hand from the not infinite propagation speed of the electrons and on the other hand from the time constants resulting from the resistive, capacitive and inductive properties of the line. It will be seen that the main line can furthermore comprise other elements introducing a delay, notably a buffer amplifier BF, inserted between the input and the output of the line so as to regenerate the clock signal. In this case, the delay necessarily introduced by this amplifier forms part of the overall delay of duration T introduced by the line.

A compensation conducting line LS with multiple outputs is organized as several line segments in series, with a respective output S1, S2, S3 at the ends of the segments.

The compensation line is linked to the main line at an arbitrary point of the latter and extends from the main line to a first line output S1. The distance between the point of linking with the main line and the first output is of little import, but it is obviously the same for all the partial circuits. Each segment then has a length equal to the length L of the main line or, more precisely, is configured to introduce a propagation delay of duration T like the main line. If there is a buffer amplifier in the main line, contributing to the delay T, a similar buffer amplifier will be introduced into each segment of the compensation line so as to obtain this propagation delay T in each segment.

In FIG. 3, because of the fact that one wishes to have three juxtaposed partial circuits as in FIG. 2, there are three outputs S1, S2, S3 of the compensation line and two segments, each with a delay T, respectively between the outputs S1 and S2, and S2 and S3. More generally if there are N partial circuits, there are N successive outputs of rank i=1 to N and these outputs provide a clock signal with successive delays (with respect to the upstream clock signal) mutually shifted by the duration T. Thus, whatever the propagation delay existing between the input $EH_{AMi}$ and the output S1, the delay will be increased by T on the output S2 and by 2T on the output S3; more generally, if there are N outputs, it is increased by (i−1)T on the output of rank i.

The outputs of the compensation line are each linked to a respective input of a multiplexer MUX. The connection lengths between the outputs of the compensation line and the inputs of the multiplexer are identical or practically identical so as not to introduce appreciably different propagation delays (with respect to the delay T of the main line) between these outputs and the multiplexer. An input of arbitrary rank j of the multiplexer is linked to an output of rank $S_{N-j+1}$ of the compensation line.

The multiplexer is controlled by control lines LC which define which multiplexer input, therefore which compensation line output, will be transmitted on the output of the multiplexer. For the partial circuit of rank i, the control line LC provides a signal $sel_i$ for selecting the input of rank i of the multiplexer, therefore a selection of the output of rank N−i+1 of the compensation line. The states of the control lines are static at the moment at which the compensation circuit is used.

It is the signal present on this output of rank N−i+1 which will be transmitted as multiplexer output. The output of the multiplexer of the circuit of rank i then provides a local clock signal $ClkL_i$ which will be used in the partial circuit of rank i; this signal is for example transmitted, so as to be used, to the corresponding control circuit CTRL. The local clock signals of the various partial circuits are simultaneous because of the compensation established by the compensation line.

The delay existing between the local clock signal $ClkL_i$ and the master clock signal CLK is not precisely known: it depends on the location of the junction point between the main line and the compensation line (distance between this junction point and the input $EH_{AMi}$); it depends on the distance between this junction point and the first output S1 of the compensation line; it depends on the connection length between the outputs of the compensation line and the multiplexer; it depends on the inherent delay introduced by the multiplexer; it depends on the connection length at the output of the multiplexer. But these delay elements are the same for all the partial circuits; whatever delay they introduce, it may be said that there is no delay between a local clock signal $ClkL_i$ and a local clock signal $ClkL_{i+1}$ of an adjacent partial circuit; indeed, the delay T introduced by the length of the main line in going from one partial circuit to the following partial circuit is fully compensated by the fact that the partial circuit of rank i uses the output of rank N−i+1 of the secondary line whereas the following partial circuit of rank i+1 uses the output of preceding rank N−i of the compensation line, these two outputs being separated by a segment introducing the same propagation delay T as the main line.

In order for each partial circuit of rank i to select the appropriate input of the multiplexer, that is to say the input of rank i linked to the output of rank N−i+1 of the compensation line, provision is preferably made for the multiplexer to possess control lines which propagate from a control input of the partial circuit to a control output which is itself linked to the control input of the following partial circuit (link by simple abutting of the patterns of the juxtaposed partial circuits); but this propagation occurs each time while incrementing the rank of the selected input; in other words, the propagated control signal is slightly different from the control signal received, but the difference (incrementation by one unit) is the same for all the partial circuits. Thus, although the partial circuits and notably the organization of the control lines is exactly the same from one circuit to the next (including the circuit allowing the incrementation), the multiplexer of the partial circuit of rank i is controlled differently from the next partial circuit. The first partial circuit receives a command which selects the input of rank 1 therefore the output of rank 1 (S3 in FIG. 2) of the compensation line.

The control lines associated with the multiplexer of the partial circuit of rank i are seen in FIG. 3: they receive a specific selection signal $sel_i$ and transmit a signal to the circuit of following rank i+1. A circuit for incrementing a unit, designated by INCR, is then inserted between the control lines arriving at the multiplexer and the control outputs intended for the following partial circuit.

Figure 4:
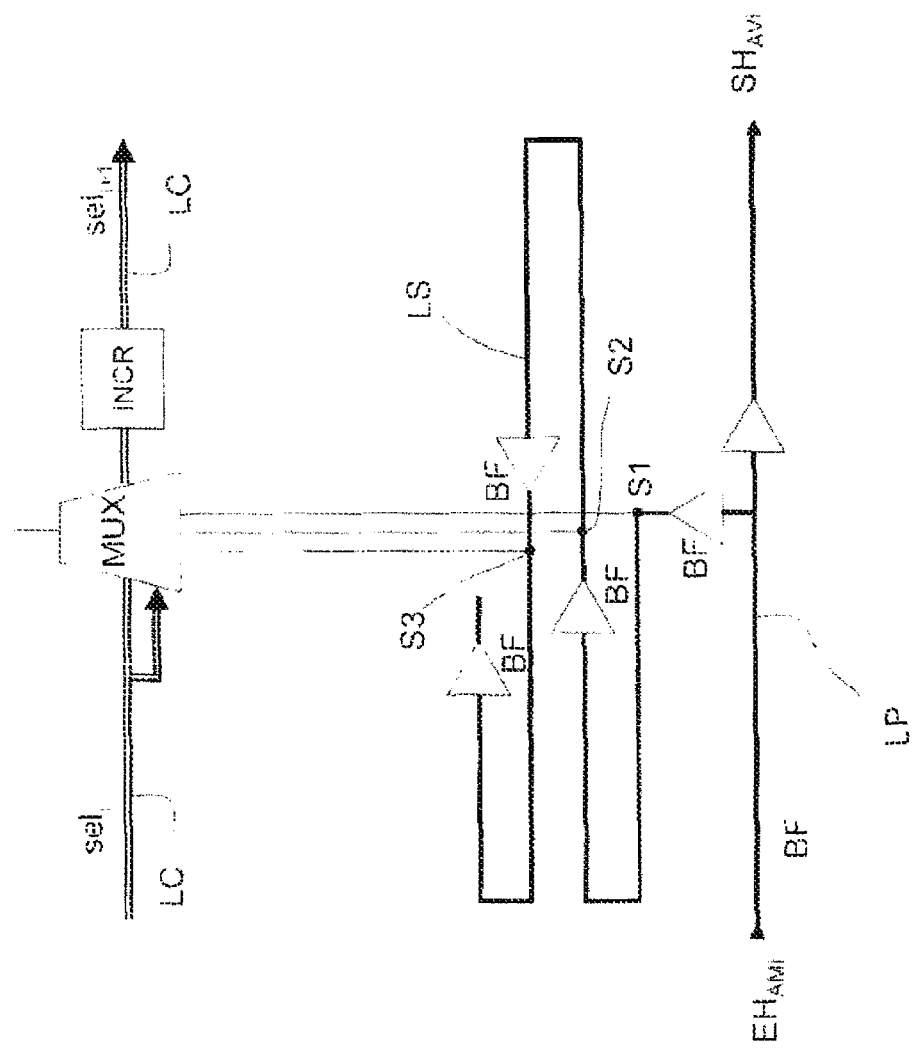
FIG. 4 represents an embodiment of the compensation circuit with a buffer amplifier in the main line and buffer amplifiers in the segments of the compensation line.

Represented as a magnified view in FIG. 4 are the main line LP and the compensation line LS in the case where the main line comprises at least one buffer amplifier whose function is to restore the amplitude of the clock signal transmitted, the latter having a tendency to weaken in the course of its propagation over the main line. In this case, the buffer amplifier (designated by the generic label BF in FIG. 4) introduces an additional delay in the propagation of the clock edges. The duration T of propagation delay of the main line comprises the sum of this delay and of the inherent delay of the conducting line itself. It is then necessary to make provision for an identical delay T in each segment of the compensation line LS, and the best is therefore to insert into each segment a buffer amplifier BF identical to the amplifier inserted into the main line.

In the example of FIG. 4, the buffer amplifier is placed immediately at the input of the main line, and provision has been made for an amplifier BF inserted into the first segment of compensation line between the output S1 and the output S2, and then another amplifier BF inserted into the second segment between the output S2 and the output S3.

Furthermore, given that the inherent delay introduced by an amplifier can depend on the load of this amplifier, matters are arranged as far as possible such that the loads of all these amplifiers are identical. This is why provision can be made, as visible in FIG. 4, for the compensation line LS to be extended, downstream of the output S3, by a line segment loaded by an amplifier. Likewise, provision may be made for the compensation line to comprise, upstream of the output S1, an amplifier between the main line and the output S1. Finally, the load of the amplifier BF of the main line consists of the main line itself loaded by the amplifier BF of the main line of the partial circuit situated immediately downstream.

In this manner, all the amplifiers situated between the main line and the last output S3 are loaded substantially by the same impedance which is mainly the impedance of a line segment loaded by an amplifier.

Figure 5:
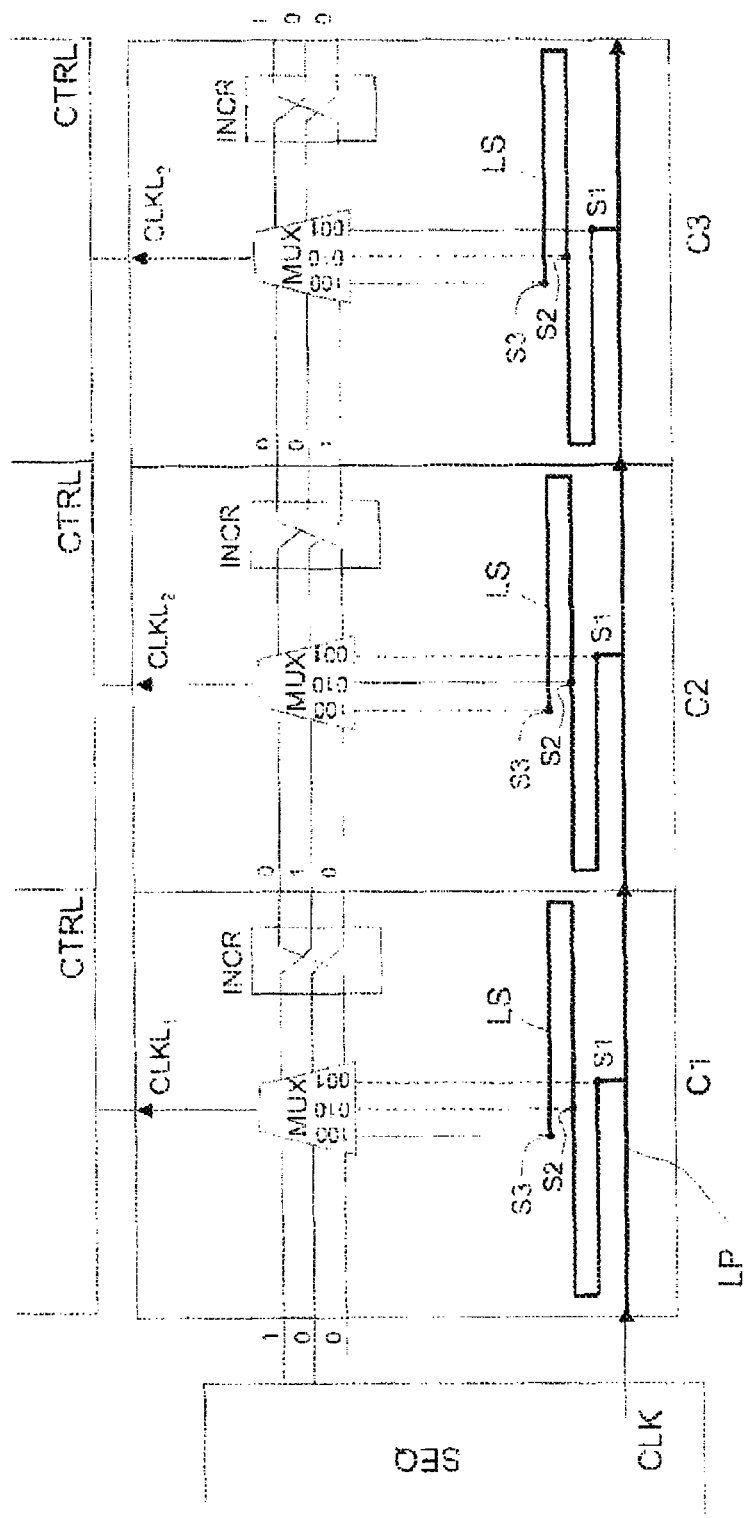
FIG. 5 represents a diagram of several juxtaposed partial circuits, with a control of the multiplexer by simple circular permutation of the order of the N control lines.

FIG. 5 represents an exemplary embodiment of the multiplexer control lines, making it possible to ensure the incrementation of the rank of the input of the multiplexer, therefore the decrementation of the rank of the output selected by the multiplexer. In this example, there are as many control lines as there are partial circuits and the multiplexer receives the N control lines; a single of these lines receives an active logic level (1) and the multiplexer is designed to select the input of rank i when the control line of rank i is activated; the other lines receive a non-active level (0). The input of rank i is linked to the output of rank N−i+1 of the compensation line and it is then the clock signal present on this output which will be transmitted on the output of the multiplexer. In FIG. 5, the link between a multiplexer input and the selected output has been represented by solid lines, and the links with the unselected outputs have been represented by dashed lines, for each of the three partial circuits represented. The configuration is transposable to N partial circuits, then using N control lines for the multiplexers.

The incrementation circuit may be, as represented in FIG. 5, simply a circuit for circularly permuting the control lines: a line of arbitrary rank j in a partial circuit of rank i becomes a line of rank j+1 in the partial circuit of rank i+1. In particular, the line of rank i in the partial circuit of rank i selects the output of rank N−i+1 of this partial circuit, and then is extended as a line of rank i+1 in the following circuit of rank i+1 and it selects the output of rank N−i of this following circuit.

Other incrementation circuits could be provided, notably using shift registers whose incrementation is ensured by the partial circuit so that after a phase of initialization of the integrated circuit the shift registers contain different codes (001, 010, 100) for each partial circuit, these codes controlling the selection of different inputs of the multiplexer. The multiplexer can also decode more conventional counting codes such as binary codes (00, 01, 10) or Gray codes (00, 01, 11), notably if shift registers are used.

The invention applies mainly to integrated circuits formed by photorepetition, but can apply more generally to any integrated circuit formed by a plurality of identical adjacent patterns, independently of their mode of fabrication.

The invention claimed is:

1. An integrated circuit comprising N adjacent patterns, all identical, corresponding to N adjacent identical partial circuits of rank i=1 to i=N in the order of geographical succession of the partial circuits, each partial circuit comprising a main conducting line connected in cascade to the main conducting lines of the partial circuits of immediately preceding and immediately following rank, so as to allow the transmission in cascade of a master signal received on the partial circuit of rank 1, each main line introducing a propagation delay of duration T between an input of the main line and an output of the main line linked to a main line input of the circuit of immediately following rank, the integrated circuit comprising in each partial circuit of rank i:
   a compensation conducting line with N successive outputs of rank i=1 to N, linked to the main line and establishing a propagation delay of duration T between the successive outputs,
   a multiplexer with N inputs linked respectively to each of the N outputs of the compensation conducting line, and
   control lines of the multiplexer, which are designed to select the multiplexer's input of rank i, linked to the output of rank N−i+1 from among the N outputs of the compensation conducting line,
the output of the multiplexer of the partial circuit of rank i thus providing a local signal for this partial circuit.

2. The integrated circuit of claim 1, wherein the master signal is a general clock signal and the local signal arising from the multiplexer of rank i is a local clock signal for the partial circuit of rank i.

3. The integrated circuit of claim 1, wherein the control lines of the multiplexer of the partial circuit of rank 1 are configured to receive a signal for selecting the input of rank N of this multiplexer and to propagate this signal from one multiplexer to the following while modifying it each time so as to increment the rank of the selected input by one unit, so that the control lines ending at the multiplexer of the partial circuit of rank i select the output of rank N−i+1 of the compensation line and transmit to the multiplexer of the partial circuit of rank i+1 a command for selecting the output of rank N−i.

4. The integrated circuit of claim 1, wherein the control lines of the multiplexer of the partial circuit of rank i are:
   N in number,
   configured in such a way that the activation of a control line of rank i, the other control lines being inactive, makes it possible to select the output of rank N−i+1 of the compensation line, and
   linked directly to the control lines of the multiplexer of the partial circuit of rank i+1 with a circular permutation so that the active control line of rank i of the multiplexer of the partial circuit of rank i is linked to a control line of rank i+1 of the multiplexer of the partial circuit of rank i+1, the latter line being configured to select, when it is active, the output of rank N−i of the compensation line of the partial circuit of rank i+1.

5. The integrated circuit of claim 1, wherein a respective buffer amplifier is inserted into the main line and a respective identical buffer amplifier is inserted into the compensation line between each output of the latter and the output of immediately following rank of the line.

* * * * *